(12) United States Patent
Kurita

(10) Patent No.: US 10,989,677 B2
(45) Date of Patent: Apr. 27, 2021

(54) SAMPLE COLLECTING DEVICE, SAMPLE COLLECTING METHOD, AND FLUORESCENT X-RAY ANALYSIS APPARATUS USING THE SAME

(71) Applicant: Rigaku Corporation, Tokyo (JP)

(72) Inventor: Seiitsu Kurita, Amagasaki (JP)

(73) Assignee: RIGAKU CORPORATION, Tokyo (JP)

( * ) Notice: Subject to any disclaimer, the term of this patent is extended or adjusted under 35 U.S.C. 154(b) by 0 days.

(21) Appl. No.: 16/084,349

(22) PCT Filed: Feb. 22, 2018

(86) PCT No.: PCT/JP2018/006491
§ 371 (c)(1),
(2) Date: Sep. 12, 2018

(87) PCT Pub. No.: WO2018/163848
PCT Pub. Date: Sep. 13, 2018

(65) Prior Publication Data
US 2019/0086344 A1 Mar. 21, 2019

(30) Foreign Application Priority Data

Mar. 7, 2017 (JP) .............................. JP2017-042943

(51) Int. Cl.
*G01N 23/223* (2006.01)
*G01N 1/40* (2006.01)
(Continued)

(52) U.S. Cl.
CPC ............. *G01N 23/223* (2013.01); *G01N 1/40* (2013.01); *G01N 1/405* (2013.01); *G01N 1/4022* (2013.01);
(Continued)

(58) Field of Classification Search
CPC ...... G01N 23/223; G01N 1/40; G01N 1/4022; G01N 1/405; G01N 23/2202;
(Continued)

(56) References Cited

U.S. PATENT DOCUMENTS

2008/0121027 A1 4/2008 Stoffelsma et al.
2010/0046700 A1 2/2010 Sakai et al.
2016/0299089 A1 10/2016 Yamagami et al.

FOREIGN PATENT DOCUMENTS

JP 10-300684 A 11/1998
JP 10300684 A 11/1998
(Continued)

OTHER PUBLICATIONS

Luan, Lin, et al. "Chip scale optical microresonator sensors integrated with embedded thin film photodetectors on electrowetting digital microfluidics platforms." IEEE Sensors Journal 12.6 (2011): 1794-1800.*

(Continued)

*Primary Examiner* — Robert J Eom
(74) *Attorney, Agent, or Firm* — HEA Law PLLC

(57) ABSTRACT

Provided is a fluorescent X-ray analysis apparatus, including: a collecting portion configured to drop a liquid droplet onto a substrate having an object to be measured on a surface thereof and move the dropped liquid droplet on the surface of the substrate to collect the object to be measured into the liquid droplet; a drying portion configured to dry the liquid droplet so that the object to be measured is held onto the surface of the substrate; an analysis portion configured to irradiate the object to be measured with an X-ray and perform quantitative analysis of an element contained in the object to be measured based on a fluorescent X-ray output from the object to be measured; a beam sensor configured to emit a laser having a band shape for detecting an amount of the liquid droplet separated from the collecting portion (Continued)

before the liquid droplet is dried after the object to be measured is collected; and a calculating portion configured to calculate a correction coefficient for correcting the amount of the liquid droplet or a quantitative analysis value of the object to be measured based on a detection result of the beam sensor.

10 Claims, 10 Drawing Sheets

(51) Int. Cl.
 *G01N 23/2202* (2018.01)
 *G01T 1/36* (2006.01)
 *H01L 21/66* (2006.01)
(52) U.S. Cl.
 CPC ........... *G01N 23/2202* (2013.01); *G01T 1/36* (2013.01); *G01N 2001/4027* (2013.01); *G01N 2223/076* (2013.01); *H01L 22/12* (2013.01)
(58) Field of Classification Search
 CPC ...... G01N 2001/4027; G01N 2223/076; G01T 1/36; H01L 22/12
 See application file for complete search history.

(56) References Cited

FOREIGN PATENT DOCUMENTS

| JP | 11-174006 A | 7/1999 |
|---|---|---|
| JP | 11174006 A | 7/1999 |
| JP | 2003-75375 A | 3/2003 |
| JP | 2003075375 A | 3/2003 |
| JP | 2004-333364 A | 11/2004 |
| JP | 2004333364 A | 11/2004 |
| JP | 3811718 B2 | 8/2006 |

OTHER PUBLICATIONS

Fu, Jing-Lin, et al. "Laser-induced fluorescence detection system for microfluidic chips based on an orthogonal optical arrangement." Analytical chemistry 78.11 (2006): 3827-3834.*
Funahashi, M., et al. "Enhanced analysis of particles and vapor phase decomposition droplets by total-reflection X-ray fluorescence." Spectrochimica Acta Part B: Atomic Spectroscopy 54.10 (1999): 1409-1426.*
Smith, James Arthur, Ulrich W. Rathe, and Christian P. Burger. "Lasers with optical feedback as displacement sensors." Optical Engineering 34.9 (1995): 2802-2811.*
Hellin, David, et al. "Validation of vapor phase decomposition-droplet collection-total reflection X-ray fluorescence spectrometry for metallic contamination analysis of silicon wafers." Spectrochimica Acta Part B: Atomic Spectroscopy 59.8 (2004): 1149-1157. (Year: 2004).*
Japanese and English Translation of Written Opinion for International Application No. PCT/JP2018/006491, dated Apr. 3, 2018, 8 pgs.
Japanese and English Translation of International Search Report for International Application No. PCT/JP2018/006491, dated Apr. 3, 2018, 8 pgs.
European Office Action dated Feb. 26, 2019.
International Search Report of PCT/JP2018/006491 dated Apr. 3, 2018.

* cited by examiner (a)

(b)

(a)

(b)

(a)

(b)

(a)

(b)

(a)

(b)

(a)

(b)

SAMPLE COLLECTING DEVICE, SAMPLE COLLECTING METHOD, AND FLUORESCENT X-RAY ANALYSIS APPARATUS USING THE SAME

CROSS-REFERENCE TO RELATED APPLICATION

This application is a continuation of PCT/JP2018/006491 filed Feb. 22, 2018 which claims priority to Japanese Patent Application JP 2017-042943 filed on Mar. 7, 2017, the entire contents of both applications are hereby incorporated by reference in their entirety.

TECHNICAL FIELD

The present invention relates to a sample collecting device, a sample collecting method, and a fluorescent X-ray analysis apparatus using the sample collecting device and the sample collecting method.

BACKGROUND ART

There has been known a fluorescent X-ray analysis apparatus configured to irradiate a sample to be measured with an X-ray and detect an element contained in the sample based on an output fluorescent X-ray. For example, as a method of detecting a contaminated substance adhering to a semiconductor substrate, an analysis method using the fluorescent X-ray analysis apparatus is used. In order to perform fluorescent X-ray analysis, a certain mass or more of a sample to be measured is required. When the amount of the contaminated substance adhering to the substrate is extremely small, the contaminated substance cannot be detected by the fluorescent X-ray analysis in some cases. In view of the foregoing, there has been known a vapor phase decomposition (VPD) method enabling analysis by collecting the contaminated substance into one place with a liquid droplet.

For example, in Patent Literature 1, there is disclosed a sample collecting device for fluorescent X-ray analysis configured to drop a solution onto a substrate having an object to be measured on a surface thereof and move the solution on the surface of the substrate while holding the solution with a holder to collect the object to be measured. It is also disclosed that, after the object to be measured is collected, it is automatically confirmed whether or not the solution containing the object to be measured has been dried.

CITATION LIST

Patent Literature

[Patent Literature 1] JP 2003-75375 A

SUMMARY OF INVENTION

Technical Problem

In a related-art sample collecting device used in the VPD method, when a contaminated impurity adhering to an inclined portion (bevel) on an end surface or a periphery of a substrate is collected, a liquid droplet is formed on the bevel. In this case, when the liquid droplet reaches a back surface of the substrate or falls from the substrate, the impurity may not be sufficiently collected.

Further, as in the sample collecting device for fluorescent X-ray analysis disclosed in Patent Literature 1, even when it is possible to detect whether or not the liquid droplet is present on the substrate, the mass of the impurity to be collected may be insufficient in the case where a part of the liquid droplet reaches the back surface of the substrate or a part of the liquid droplet falls from the substrate.

The present invention has been made in view of the above-mentioned problems, and an object of the present invention is to provide a sample collecting device, a sample collecting method, and a fluorescent X-ray analysis apparatus using the sample collecting device and the sample collecting method, in which, when a contaminated impurity adhering to a substrate is collected, even in the case where a part of a liquid droplet falls from an end portion of the substrate or reaches a back surface of the substrate, an analysis result obtained by quantifying the impurity can be corrected or the above-mentioned situation can be detected.

Solution to Problem

A fluorescent X-ray analysis apparatus of claim 1 includes: a collecting portion configured to drop a liquid droplet onto a substrate having an object to be measured on a surface thereof and move the dropped liquid droplet on the surface of the substrate to collect the object to be measured into the liquid droplet; a drying portion configured to dry the liquid droplet so that the object to be measured is held onto the surface of the substrate; an analysis portion configured to irradiate the object to be measured with an X-ray and perform quantitative analysis of an element contained in the object to be measured based on a fluorescent X-ray output from the object to be measured; a beam sensor configured to emit a laser having a band shape for detecting an amount of the liquid droplet separated from the collecting portion before the liquid droplet is dried after the object to be measured is collected; and a calculating portion configured to calculate a correction coefficient for correcting the amount of the liquid droplet or a quantitative analysis value of the object to be measured based on a detection result of the beam sensor.

According to a fluorescent X-ray analysis apparatus of claim 2, in the fluorescent X-ray analysis apparatus of claim 1, the beam sensor is arranged so that the laser is emitted with a traveling direction being parallel to the surface of the substrate, and the band of the laser is perpendicular to the surface of the substrate.

According to a fluorescent X-ray analysis apparatus of claim 3, in the fluorescent X-ray analysis apparatus of claim. 2, the beam sensor includes a regression reflection type beam sensor including a beam sensor main body that includes an oscillator configured to emit the laser and a light receiver configured to receive the laser and a reflective plate opposed to the beam sensor main body.

According to a fluorescent X-ray analysis apparatus according to claim 4, in the fluorescent X-ray analysis apparatus of claim 2, the beam sensor includes a transmission type beam sensor including an oscillator configured to emit the laser and a light receiver arranged so as to be opposed to the oscillator and configured to receive the laser.

According to a fluorescent X-ray analysis apparatus of claim 5, the fluorescent X-ray analysis apparatus of any one of claims 1 to 4 further includes a moving mechanism configured to move the substrate so that the liquid droplet crosses the laser having a band shape.

According to a fluorescent X-ray analysis apparatus of claim 6, the fluorescent X-ray analysis apparatus of any one of claims 1 to 5 further includes a rotating table configured to rotate the substrate within a horizontal plane when the laser is emitted to the liquid droplet.

According to a fluorescent X-ray analysis apparatus of claim 7, in the fluorescent X-ray analysis apparatus of claim 6, the calculating portion is configured to calculate the correction coefficient for correcting the amount of the liquid droplet or the quantitative analysis value of the object to be measured based on the detection result of the beam sensor with reference to a correlation in accordance with a distance from a center at which the substrate is rotated by the rotating table to the dropped liquid droplet.

According to a fluorescent X-ray analysis apparatus of claim 8, the fluorescent X-ray analysis apparatus of any one of claims 1 to 7 further includes a warning notifying portion configured to notify a warning when a difference between the detection result of the beam sensor and a value set in accordance with the amount of the dropped liquid droplet is larger than a value set in advance.

A sample collecting device of claim 9 includes: abeam sensor configured to emit a laser having a band shape to a liquid droplet after the liquid droplet is dropped onto a substrate having an object to be measured on a surface thereof and the dropped liquid droplet is moved on the surface of the substrate to collect the object to be measured into the liquid droplet; and a calculating portion configured to calculate a correction coefficient for correcting the amount of the liquid droplet or a quantitative analysis value of the object to be measured based on a detection result of the beam sensor.

A sample collecting method of claim 10 includes: dropping a liquid droplet onto a substrate having an object to be measured on a surface thereof, moving the dropped liquid droplet on the surface of the substrate to collect the object to be measured into the liquid droplet, and emitting a laser having a band shape to the liquid droplet; and calculating a correction coefficient for correcting the amount of the liquid droplet or a quantitative analysis value of the object to be measured based on a detection result of the beam sensor.

Advantageous Effects of Invention

In the inventions according to claims 1, 3 to 6, 9 and 10, when an impurity adhering to the substrate is collected, the amount of the liquid droplet on the surface of the substrate is detected. As a result, it can be detected that a part of the liquid droplet has fallen from an end portion of the substrate or has reached a back surface of the substrate, and the quantitative analysis value of the impurity can be corrected.

Further, according to the invention of claim 2, the band of the laser is arranged so as to be perpendicular to the surface of the substrate. As a result, the amount of the liquid droplet on the surface of the substrate can be accurately detected, and the quantitative analysis value of the impurity can be accurately corrected.

Further, according to the invention of claim 7, the correction coefficient for correcting the amount of the liquid droplet or the quantitative analysis value of the object to be measured is calculated based on the detection result of the beam sensor with reference to the correlation in accordance with the distance from the center at which the substrate is rotated by the rotating table to the dropped liquid droplet. As a result, the amount of the liquid droplet on the surface of the substrate can be accurately detected, and the quantitative analysis value of the impurity can be accurately corrected.

Further, according to the invention of claim 8, a warning is notified when the detected amount of the liquid droplet is smaller than the amount of the dropped liquid droplet. As a result, an inaccurate quantitative analysis result is prevented from being obtained. When the quantitative analysis value is corrected, it is understood that care should be taken because the correction amount is large.

DESCRIPTION OF EMBODIMENT

Now, a preferred embodiment for carrying out the present invention (hereinafter referred to as "embodiment") will be described. A fluorescent X-ray analysis apparatus according to the present invention includes a pretreatment portion, a conveyance portion, and an analysis portion.

Figure 1:
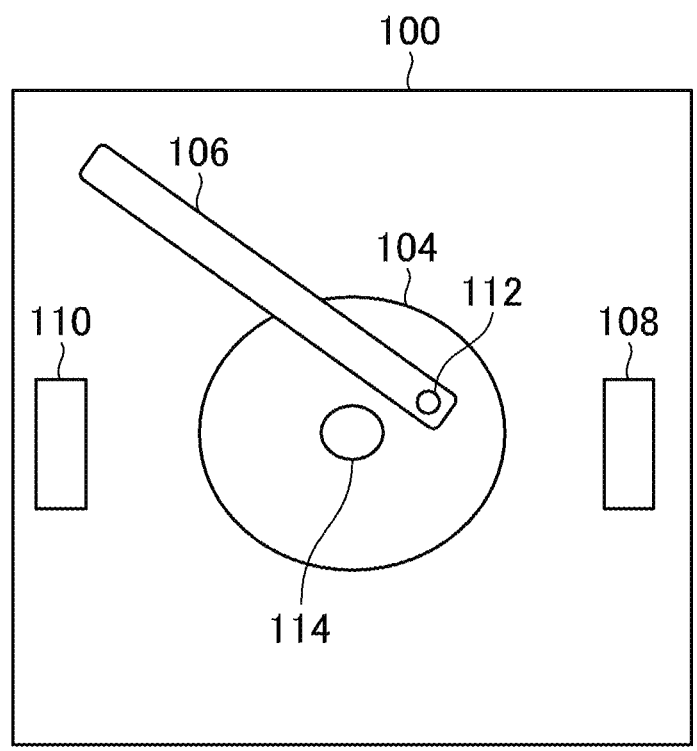
FIG. 1 are each a view for schematically illustrating a pretreatment portion according to an embodiment of the present invention.
Figure 1:
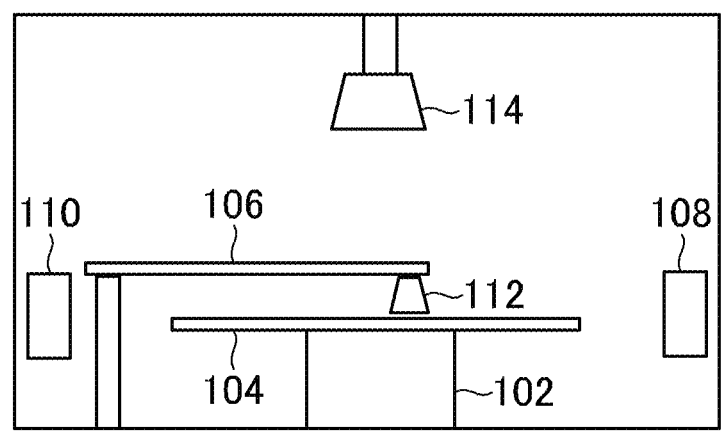

As illustrated in FIG. 1, the pretreatment portion includes a pretreatment chamber 100, and a rotating table 102, a substrate 104, a collecting portion 106, a beam sensor, a drying portion 114, a first calculating portion (not shown), and a warning notifying portion (not shown) that are arranged respectively in the pretreatment chamber 100. FIG. 1(a) is a view of the pretreatment portion when viewed from above, and FIG. 1(b) is a view of the pretreatment portion when viewed from a side surface.

Figure 2:
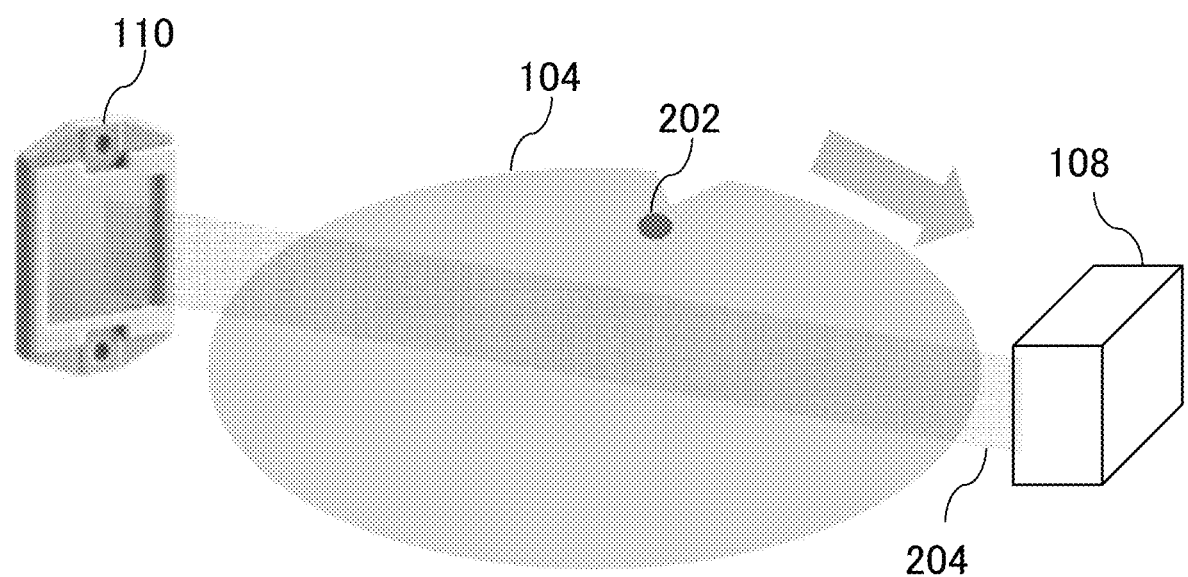
FIG. 2 is a view for illustrating a laser emitted from a beam sensor.

When a laser 204 is emitted to the liquid droplet 202, the rotating table 102 rotates the substrate 104 within a horizontal plane. Specifically, the substrate 104 to be measured is mounted with the center thereof being aligned with a rotation axis of the rotating table 102. The rotating table 102 rotates the substrate 104 within the horizontal plane when the collecting portion 106 moves the liquid droplet 202 on the surface of the substrate 104. Further, for example, as illustrated in FIG. 2, when the laser 204 is emitted to the liquid droplet 202 after the liquid droplet 202 is separated from a nozzle 112 of the collecting portion 106, the rotating table 102 rotates the substrate 104 within the horizontal plane in a direction of an arrow.

The substrate 104 is a disc-shaped wafer having a sample to be measured adhering to the surface thereof. Specifically, the substrate 104 is, for example, a silicon wafer or a gallium arsenide wafer. The sample is, for example, a contaminated impurity that adheres to the substrate 104 during a manufacturing process thereof.

The collecting portion 106 is configured to drop the liquid droplet 202 onto the substrate 104 having an object to be measured on the surface thereof and move the dropped liquid droplet 202 on the surface of the substrate 104 to collect the object to be measured into the liquid droplet 202. Specifically, the collecting portion 106 includes the nozzle 112 configured to drop a hydrofluoric acid solution that dissolves the sample.

Further, the collecting portion 106 is configured to move the liquid droplet 202 from the center of the substrate 104 toward an end portion of the substrate under a state in which the nozzle 112 holds the liquid droplet 202. The rotating table 102 rotates the substrate 104 when the collecting portion 106 moves the liquid droplet 202, and thus the liquid droplet 202 takes in the object to be measured adhering to the entire substrate 104.

After the collecting portion 106 collects the object to be measured into the liquid droplet 202, the collecting portion 106 separates the liquid droplet 202 from the nozzle 112 at a position of the substrate 104 set in advance. It is not always required that the liquid droplet 202 dropped by the collecting portion 106 be a hydrofluoric acid solution. For example, as long as the liquid droplet 202 can take in the impurity, the liquid droplet 202 may be a substance that does not dissolve an impurity.

The beam sensor is configured to emit the laser 204 having a band shape for detecting the amount of the liquid droplet 202 separated from the nozzle 112 before the liquid droplet is dried after the object to be measured is collected. Specifically, for example, as illustrated in FIG. 2, the beam sensor is a regression reflection type beam sensor including a beam sensor main body 108 and a reflective plate 110. The beam sensor main body 108 includes an oscillator configured to emit the laser 204 and a light receiver configured to receive the laser 204. The reflective plate 110 is opposed to the beam sensor main body 108.

Figure 3:
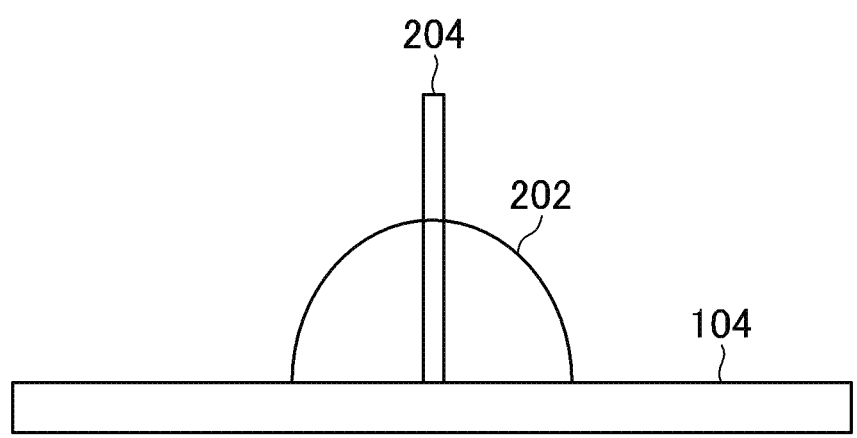
FIG. 3 is a schematic view of a liquid droplet irradiated with a laser when viewed from a side surface of a substrate.

FIG. 3 is a schematic view of the liquid droplet 202 irradiated with the laser 204 when viewed from a side surface of the substrate 104, with a region in the vicinity of the liquid droplet 202 being enlarged. The beam sensor is arranged so that the laser 204 is emitted with a traveling direction thereof being parallel to the surface of the substrate 104, and the band of the laser 204 is perpendicular to the surface of the substrate 104.

Specifically, as illustrated in FIG. 3, the laser 204 is emitted from the near side to the back side on the drawing sheet so that the traveling direction of the laser 204 is parallel to the surface of the substrate 104. Further, the laser 204 is emitted so that the band of the laser 204 is perpendicular to the surface of the substrate 104. In this case, the entire liquid droplet 202 can be irradiated with the laser 204 by rotating the substrate 104 to cause the liquid droplet 202 to pass through a region irradiated with the laser 204.

Of the laser 204 emitted from the beam sensor main body 108, a component that is not scattered by the liquid droplet 202 is reflected by the reflective plate 110 and received by the light receiver. Apart of the laser 204 that is scattered by the liquid droplet 202 in two paths, including a path in which the laser 204 is emitted and reflected by the reflective plate 110 and a path in which the laser 204 is reflected by the reflective plate 110 and received by the light receiver, does not reach the light receiver. The amount of the liquid droplet 202 can be accurately detected based on the amount of the light received by the light receiver.

The laser 204 may be scattered by the liquid droplet 202 in one path. Specifically, the beam sensor may be a transmission type beam sensor including an oscillator configured to emit the laser 204 and a light receiver arranged so as to be opposed to the oscillator and configured to receive the laser 204. In this case, the beam sensor main body 108 illustrated in FIG. 3 may be used as the oscillator configured to emit the laser 204, and the reflective plate 110 may be used as the light receiver configured to receive the laser 204.

Further, the beam sensor may be arranged in a vertical direction of the substrate 104. Specifically, the beam sensor main body 108 may be arranged in the vertical direction of the substrate 104 so that an emission portion emits the laser 204 perpendicularly to the surface of the substrate 104, and the light receiver receives the laser 204 reflected by the surface of the substrate 104.

The drying portion 114 is configured to dry the liquid droplet 202 so that the object to be measured is held on the surface of the substrate 104. Specifically, the drying portion 114 is, for example, a halogen lamp and is placed above the liquid droplet 202 by drying portion moving means (not shown). The drying portion 114 is configured to heat and dry the liquid droplet 202 separated from the nozzle 112. In a region of the substrate 104 in which the liquid droplet 202 is dried, the sample to be measured remains.

Figure 4:
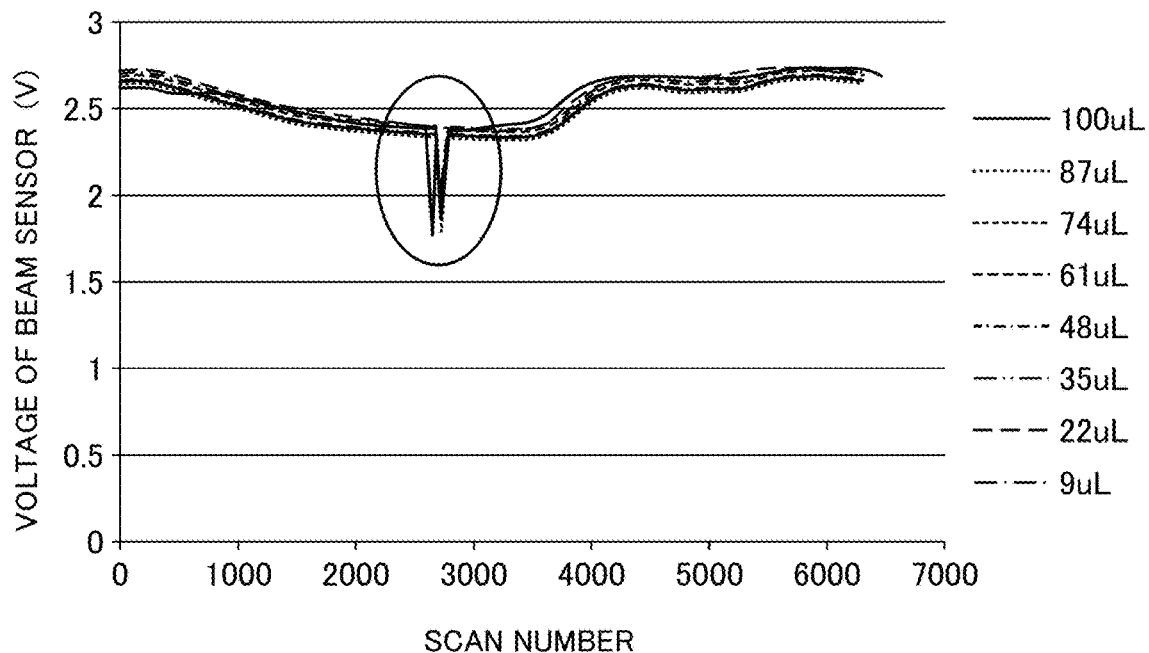
FIG. 4 are each a graph for showing results of a first experimental example.
Figure 4:
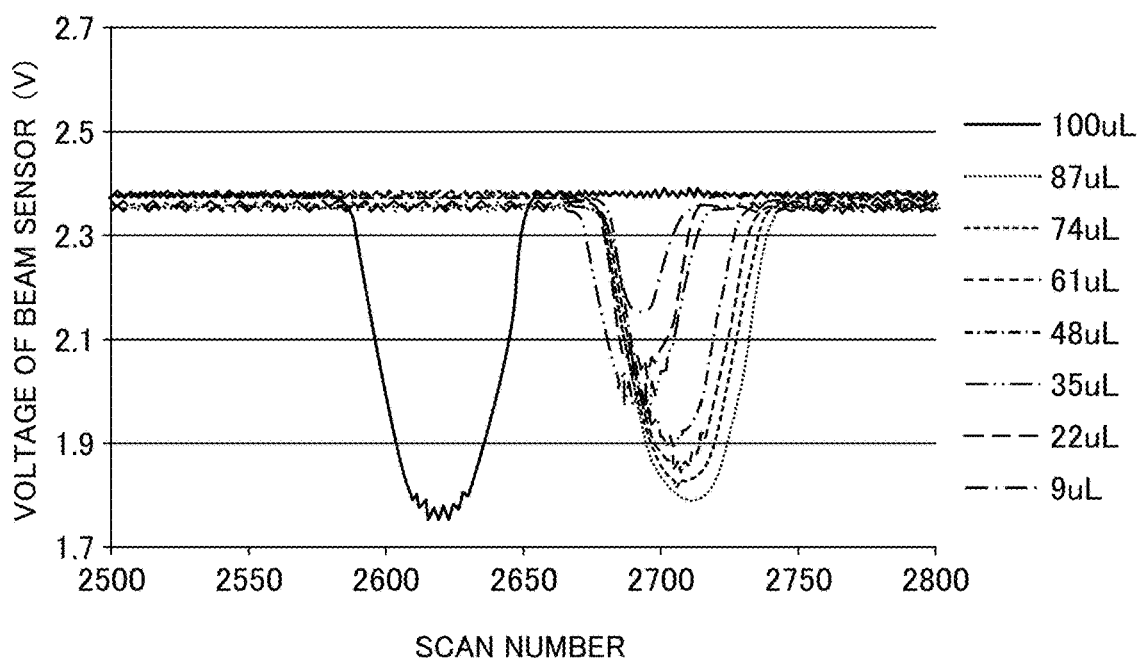

The first calculating portion is configured to calculate a correction coefficient for correcting the amount of the liquid droplet 202 or the quantitative analysis value of the object to be measured based on a detection result of the beam sensor. Specifically, description is given based on a first experimental example shown in FIG. 4 and FIG. 5. FIG. 4(a) and FIG. 4(b) are each a graph for showing experimental results obtained by dropping the liquid droplet 202 in an amount of from 9 μL to 100 μL onto the substrate 104 and measuring the amount of the liquid droplet 202. The vertical axis of FIG. 4 represents an output voltage of the beam sensor. The horizontal axis represents a scan number at which the output voltage of the beam sensor is successively read while the substrate 104 is rotated at a constant speed, and corresponds to a rotation angle of the substrate 104.

The measurement data shown in FIG. 4(a) is data measured by rotating the substrate 104 by a half turn. A region surrounded by a circle is a region in which the output voltage of the beam sensor decreases when the laser 204 is scattered by the liquid droplet 202.

FIG. 4(b) is a graph for showing the region surrounded by the circle of FIG. 4(a) in an enlarged state. As shown in FIG. 4(b), the larger the amount of the liquid droplet 202, the more a peak voltage decreases, and the smaller the amount of the liquid droplet, the more the peak voltage increases. Further, the scan number indicating the peak voltage varies depending on the position of the substrate 104 in a circumferential direction at which the liquid droplet 20 is dropped.

Figure 5:
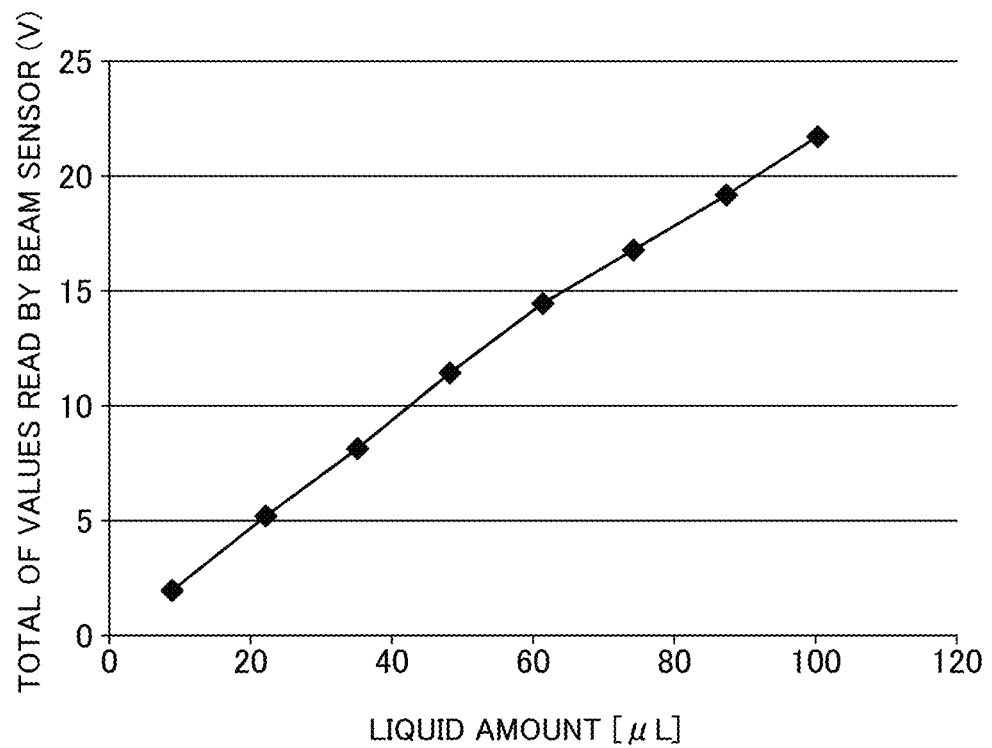
FIG. 5 is a graph for showing a correlation obtained in the first experimental example.

FIG. 5 is a graph for showing a relationship between the amount of the dropped liquid droplet 202 and a total of values read by the beam sensor, calculated based on each measurement result shown in FIG. 4(b). Here, the total of values read by the beam sensor is a value obtained by integrating voltages in which one peak decreases with reference to the sensor output voltage in a region in which the liquid droplet 202 is not present. As shown in FIG. 5, as the amount of the liquid droplet 202 increases, the total of values read by the beam sensor increases. Thus, the first calculating portion can calculate the amount of the liquid droplet 202 based on the detection result of the beam sensor by storing a relationship between the amount of the liquid droplet 202 and the total of values read by the beam sensor (hereinafter simply referred to as "correlation") in advance. Further, the correction coefficient for correcting the quantitative analysis value of the object to be measured can be calculated based on a ratio between the amount of the dropped liquid droplet and the amount of the liquid droplet before being dried. The correction coefficient may also be calculated directly based on the total of values read by the beam sensor without calculating the amount of the liquid droplet.

Figure 6:
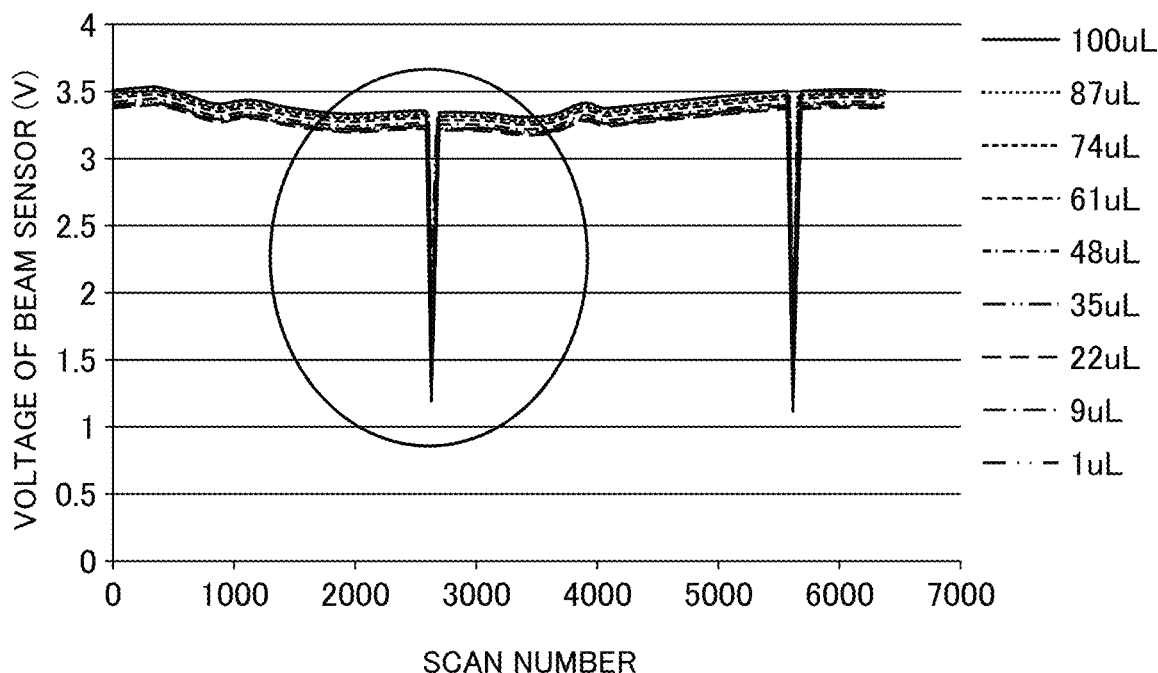
FIG. 6 are each a graph for showing results of a second experimental example.
Figure 6:
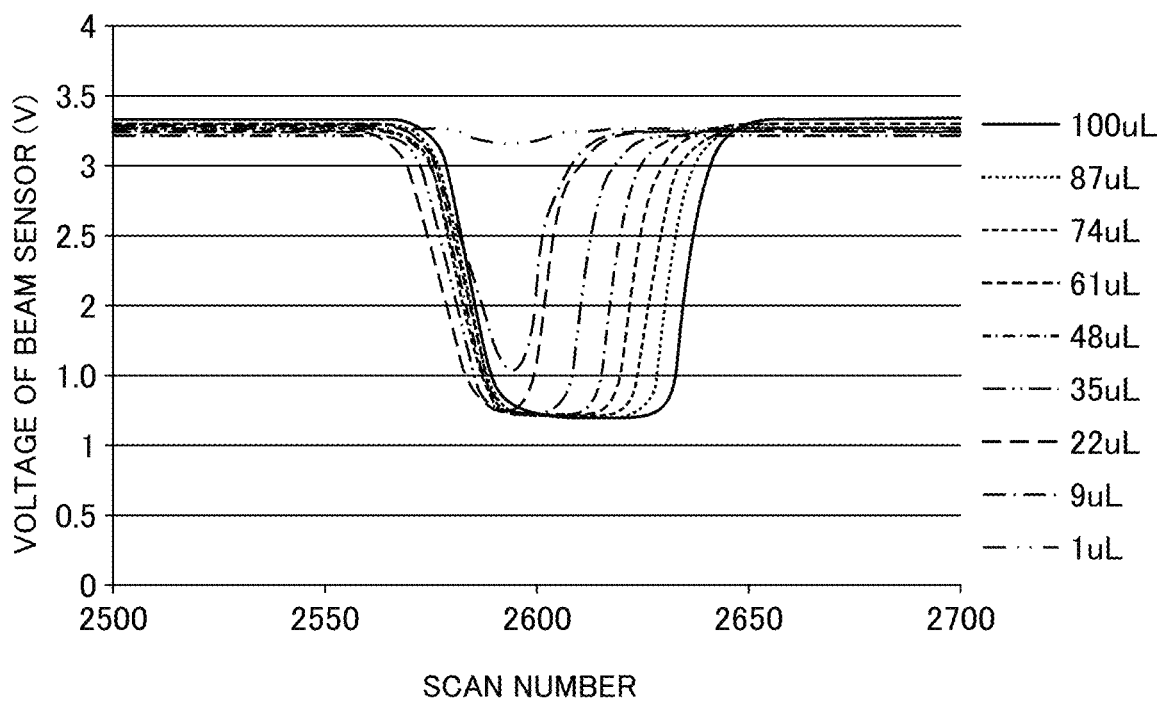

The first calculating portion may calculate the amount of the liquid droplet 202 with reference to different correlations in accordance with materials for the substrate 104 and the liquid droplet 202. Specifically, description is given based on a second experimental example shown in FIG. 6 and FIG. 7. FIG. 6(a) and FIG. 6(b) are each a graph for showing experimental results obtained by dropping the liquid droplet 202 in an amount of from 1 μL to 100 μL onto the substrate 104 and measuring the amount of the liquid droplet 202.

In FIG. 6(a), data measured by rotating the substrate 104 by one turn is shown. In a process in which the substrate 104 is rotated by one turn, the liquid droplet 202 passes through the region irradiated with the laser 202 emitted by the beam sensor twice. Thus, as shown in FIG. 6(a), when measurement is performed by rotating the substrate 104 by one turn, peaks are observed in two portions.

Further, FIG. 6(b) is a graph for showing a region surrounded by a circle of FIG. 6(a) in an enlarged state. The surface tension acting on the substrate 104 and the liquid droplet 202 varies depending on the materials for the substrate 104 and the liquid droplet 202. Thus, as shown in FIG. 6(b), a peak shape obtained in the second experimental example in which the material for the substrate 104 is different from that in the first experimental example is different from a peak shape obtained in the first experimental example shown in FIG. 4(b).

Figure 7:
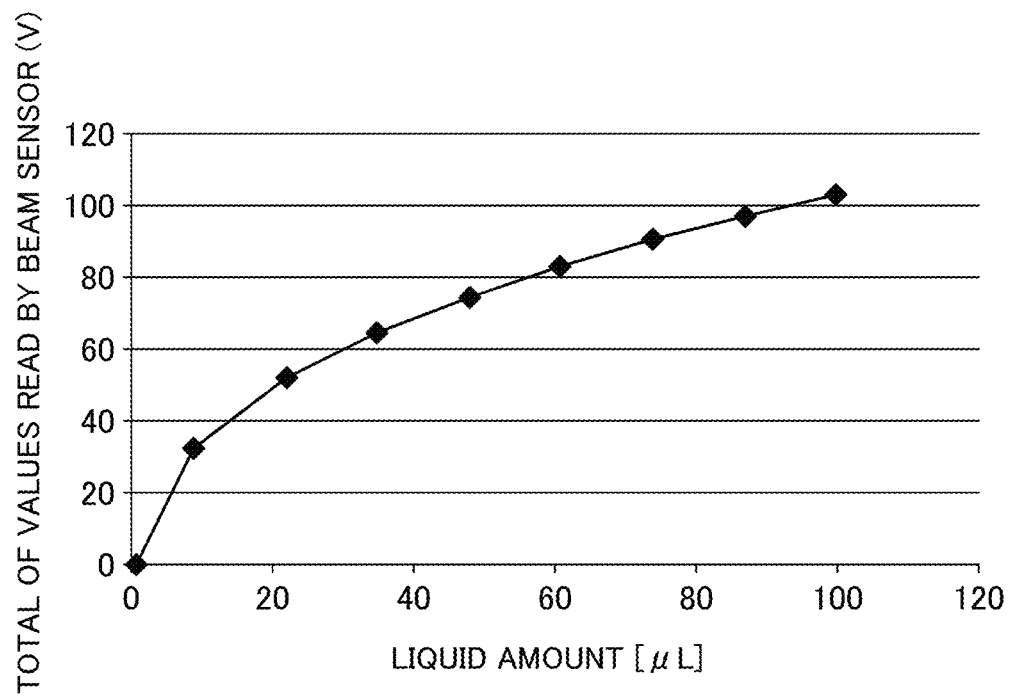
FIG. 7 is a graph for showing a correlation obtained in the second experimental example.

FIG. 7 is a graph for showing a correlation calculated based on each measurement result shown in FIG. 6(b). The peak shapes obtained in the first experimental example and the second experimental example are different from each other. Therefore, a correlation obtained in the second experimental example is different from that obtained in the first experimental example.

Thus, the first calculating portion may calculate the correction coefficient for correcting the amount of the liquid droplet 202 or the quantitative analysis value of the object to be measured with reference to the different correlations in accordance with the materials for the substrate 104 and the liquid droplet 202. As a result, compared to calculation with reference to one particular correlation, the correction coefficient for accurately correcting the amount of the liquid droplet 202 or the quantitative analysis value of the object to be measured can be calculated.

Figure 8:
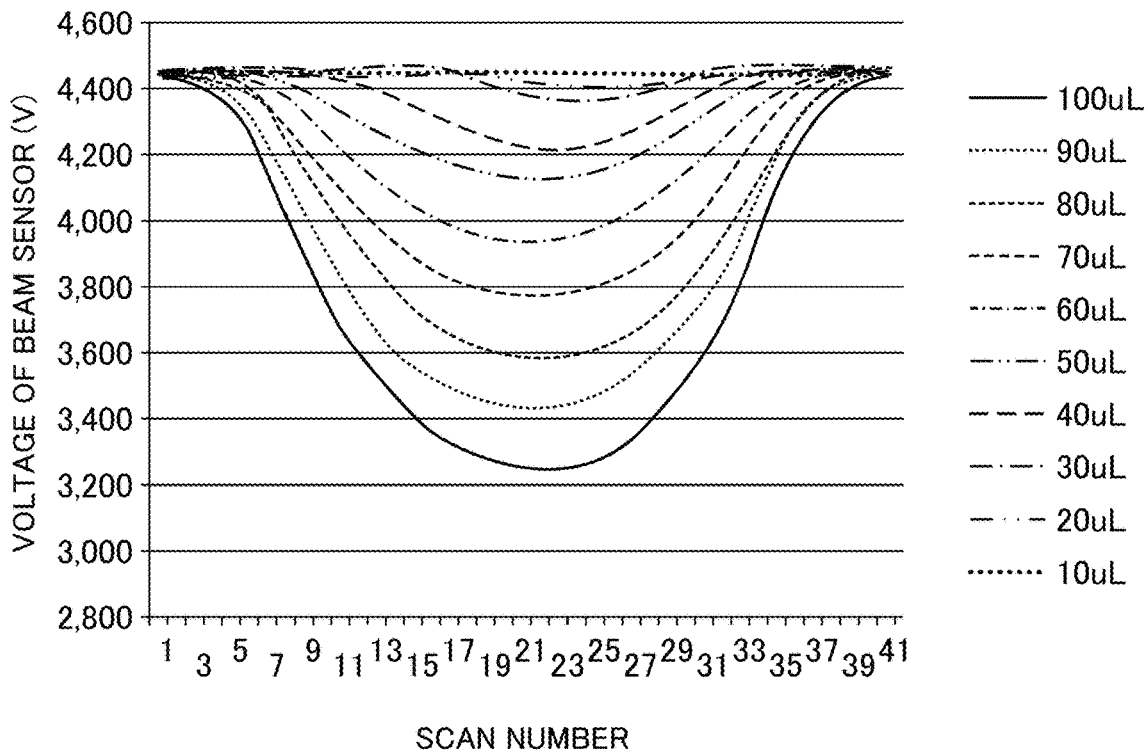
FIG. 8 are each a graph for showing results of a third experimental example and a correlation obtained therein.
Figure 8:
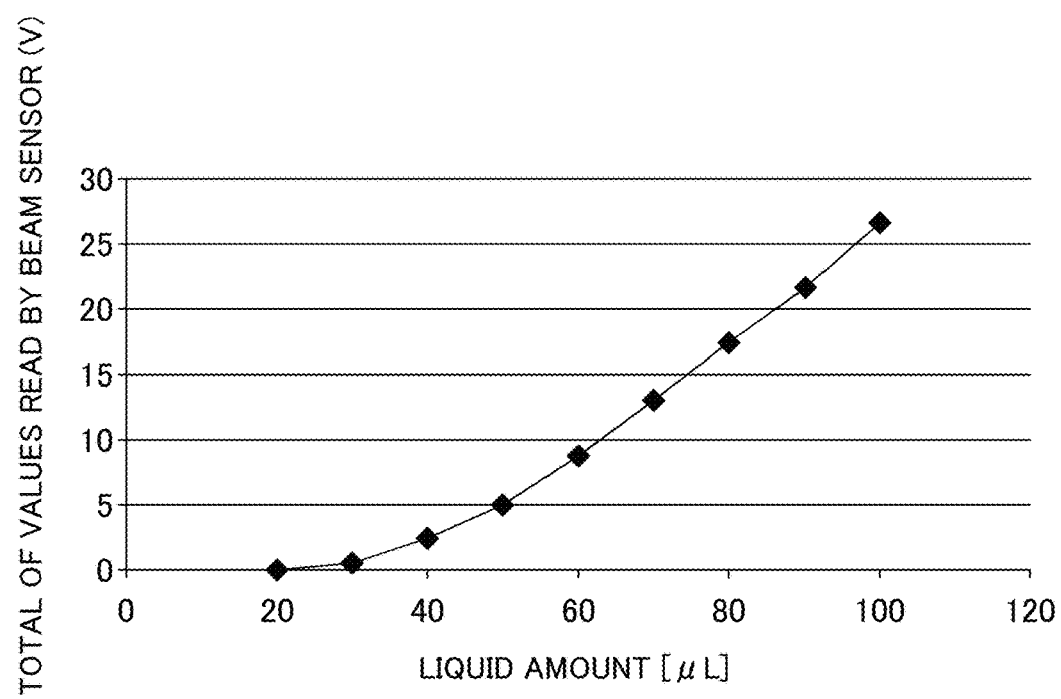
Figure 9:
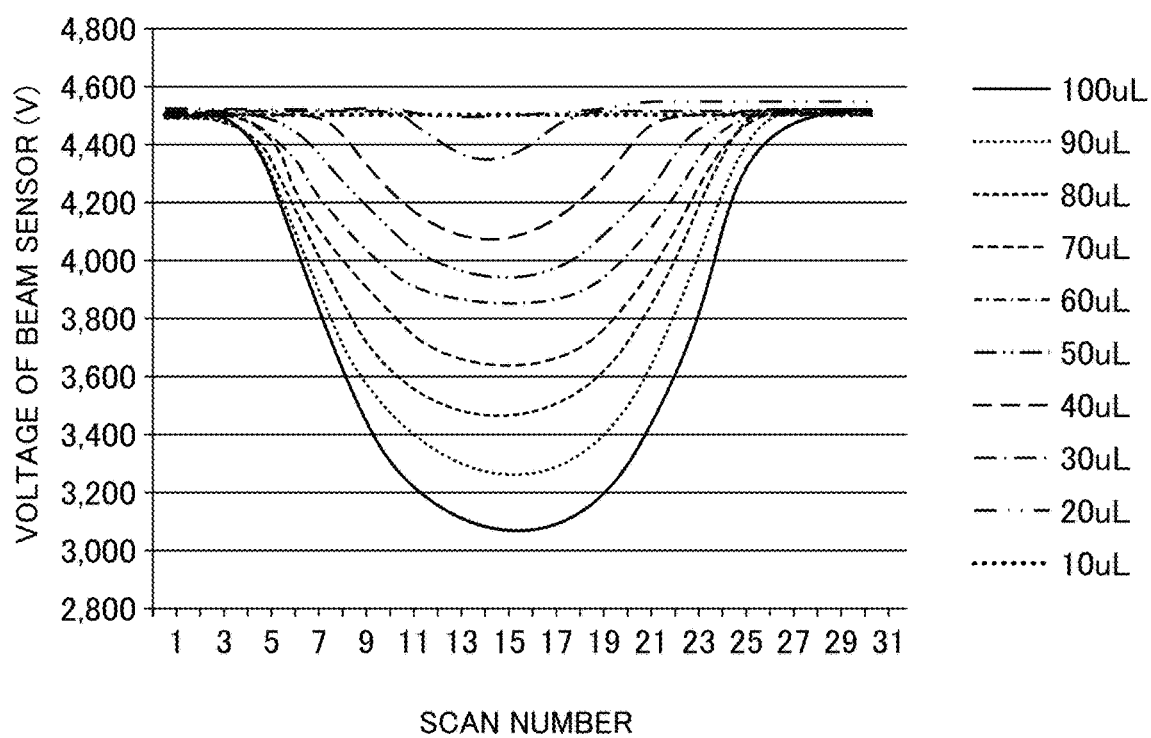
FIG. 9 are each a graph for showing results of a fourth experimental example and a correlation obtained therein.
Figure 9:
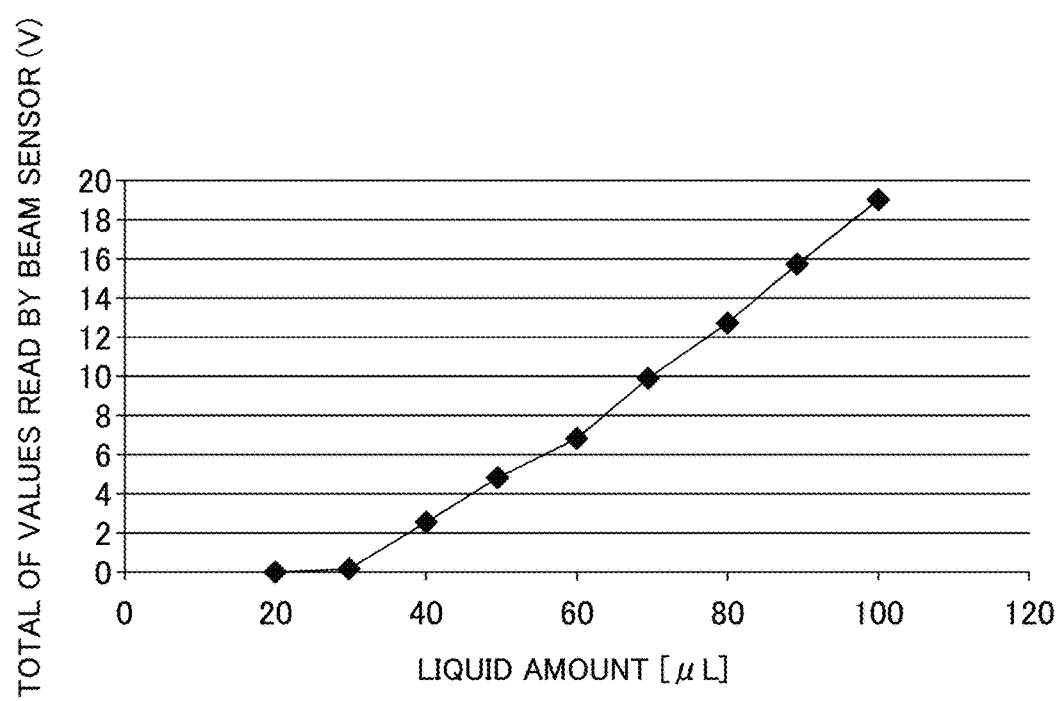

Further, the first calculating portion may calculate the correction coefficient for correcting the amount of the liquid droplet or the quantitative analysis value of the object to be measured based on the detection result of the beam sensor with reference to the correlation in accordance with the distance from the center at which the substrate is rotated by the rotating table to the dropped liquid droplet. Specifically, description is given based on a third experimental example shown in FIG. 8 and a fourth experimental example shown in FIG. 9.

FIG. 8(a) and FIG. 9(a) are each a graph for showing experimental results obtained by dropping the liquid droplet 202 in an amount of from 10 μL to 100 μL onto the substrate 104 and measuring the amount of the liquid droplet 202. Further, FIG. 8(a) is a graph for showing experimental results given when the liquid droplet 202 is formed at a position of 70 mm from the center of the substrate 104. FIG. 9(a) is a graph for showing experimental results given when the liquid droplet 202 is formed at a position of 120 mm from the center of the substrate 104.

In the third experimental example and the fourth experimental example, the distance from the center of the substrate 104 that is rotated at a constant speed to the liquid droplet 202 varies, and hence the time required for the liquid droplet 202 to pass through the laser 204 varies. As shown in FIG. 8(a) and FIG. 9(a), the peak shape varies depending on the distance. Even when the amount of the dropped liquid droplet 202 is the same, as the position at which the liquid droplet 202 becomes dropped is closer to the center of the substrate 104 serving as the rotation axis, the width of the peak becomes wider, and the total of values read by the beam sensor increases.

FIG. 8(b) and FIG. 9(b) are each a graph for showing a correlation calculated based on each measurement result shown in FIG. 8(a) and FIG. 9(a). The peak shapes obtained in the third experimental example and the fourth experimental example are different from each other, and hence the correlation in the third experimental example is different from that in the fourth experimental example. The peak shape is determined by the geometric arrangement of the dropped liquid droplet 202. Thus, the coefficient of the correlation may be a function of the distance from the center of the substrate 104 to the liquid droplet 202.

Thus, the first calculating portion may calculate the correction coefficient for correcting the amount of the liquid droplet 202 or the quantitative analysis value of the object to be measured with reference to the correlation in accordance with the distance from the center of the substrate 104 to the liquid droplet 202. As a result, the correction coefficient for correcting the amount of the liquid droplet 202 or the quantitative analysis value of the object to be measured can be accurately calculated.

The warning notifying portion is configured to notify a warning when a difference between the detection result of the beam sensor and the value set in accordance with the amount of the dropped liquid droplet 202 is larger than a value set in advance. Specifically, for example, the warning notifying portion is configured to notify a warning when a difference between the amount of the liquid droplet 202 calculated by the first calculating portion based on the detection result of the beam sensor after the object to be measured is collected, and the amount of the liquid droplet 202 initially dropped by the collecting portion 106 stored in advance through calculation, is larger than an amount set in advance.

The warning notifying portion may notify a warning based on the total of values read by the beam sensor and a comparative reference value set in advance while calculation of the amount of the liquid droplet 202 by the first calculating portion is omitted. Specifically, the first calculating portion may calculate a difference between the total of values read by the beam sensor and the comparative reference value set in advance, and the warning notifying portion may notify a warning when the difference is larger than the value set in advance. In this case, the total of values read by the beam sensor or the comparative reference value set in advance may be corrected in accordance with the distance from the center of the substrate 104 to the liquid droplet 202.

The warning notifying portion enables a measurer to perform measurement again. Further, when the substrate 104 is automatically conveyed to the analysis portion for analysis after the liquid droplet 202 is dried, it is possible to prevent the situation in which an incorrect quantitative analysis result is obtained. Further, when the quantitative analysis value is corrected, it is understood that a correction amount is large.

The conveyance portion is configured to convey the substrate 104 having been subjected to treatment in the pretreatment portion to the analysis portion. Specifically, for example, the substrate 104 having been subjected to treatment in the pretreatment portion is mounted on the conveyance portion, and the conveyance portion conveys the substrate 104 to a region to be irradiated with an X-ray, described later.

The analysis portion is configured to irradiate the object to be measured with an X-ray and analyze an element contained in the object to be measured based on a fluorescent X-ray output from the object to be measured. Specifically, for example, in the case of a total reflection X-ray fluorescence spectrometer (TXRF), the analysis portion includes an X-ray source, a spectral element, a detector, a counter, and a second calculating portion. The spectral element is configured to disperse, of an X-ray generated from the X-ray source, only a particular wavelength satisfying a so-called Bragg condition and irradiate a position at which the liquid droplet is dried with the X-ray at an extremely small angle at which the X-ray is totally reflected from the surface of the substrate 104.

The detector is, for example, a Si(Li) detector or a SDD. The detector is configured to measure an intensity of a secondary X-ray and output a pulse signal having a crest value in accordance with energy of the measured secondary X-ray. The counter is a multi-channel analyzer and is configured to count an output pulse signal of the detector for each channel corresponding to the energy of the secondary X-ray.

The second calculating portion is configured to perform quantitative analysis of the element contained in the sample based on a counting result of the counter. The quantitative analysis result can be corrected through use of the correction coefficient calculated in the first calculating portion.

As described above, according to the present invention, it can be detected that a part of the liquid droplet 202 has fallen from an end portion of the substrate 104 or has reached a back surface thereof by detecting the amount of the liquid droplet 202 on the surface of the substrate 104 when the impurity adhering to the substrate 104 is collected. Further, the quantitative analysis result obtained by fluorescent X-ray analysis can be corrected to accurately quantify the impurity adhering to the substrate 104.

Subsequently, a sample correction method using the above-mentioned fluorescent X-ray analysis apparatus is described. First, the substrate 104 to be measured is mounted on the rotating table 102.

Next, the liquid droplet 202 is dropped onto the substrate 104 having the object to be measured on the surface thereof. The dropped liquid droplet 202 is moved on the surface of the substrate 104 to collect the object to be measured into the liquid droplet 202, and thereafter, the laser 204 having a band shape is emitted to the liquid droplet 202. Specifically, the collecting portion 106 drops a hydrofluoric acid solution from the nozzle 112 mainly to the substrate 104.

Then, the rotating table 102 rotates the substrate 104, and the collecting portion 106 moves the liquid droplet 202 from the center of the substrate 104 toward an end portion thereof in a state in which the liquid droplet 202 is held by the nozzle 112. When the nozzle 112 reaches the end portion of the substrate 104, the rotating table 102 stops rotation, and the liquid droplet 202 is separated from the nozzle 112 at a position above the substrate 104 set in advance. After the liquid droplet 202 is separated from the nozzle 112, the rotating table 102 rotates the substrate 104 again. The beam sensor emits the laser 204 to detect an intensity at which the laser 204 passes through a region on the substrate 104 while the substrate 104 is rotated by one turn or a half turn.

Next, the amount of the liquid droplet 202 is calculated based on the detection result of the beam sensor. Specifically, the first calculating portion calculates the amount of the liquid droplet 202 based on the detection result of the beam sensor by storing the correlation shown in FIG. 5 and FIG. 7 to FIG. 9 in advance. Further, the correction coefficient for correcting the analysis value of the object to be measured is calculated based on the ratio between the amount of the dropped liquid droplet and the amount of the liquid droplet after the object to be measured is collected. The correction coefficient may be calculated directly based on the total of values read by the beam sensor without calculation of the amount of the liquid droplet.

Next, the warning notifying portion notifies an error when a difference between the detection result of the beam sensor and the value set in accordance with the amount of the dropped liquid droplet 202 is larger than the value set in advance. When the error is notified, the analysis apparatus stops quantitative analysis. When the quantitative analysis value is corrected without stopping of the quantitative analysis, the warning notifying portion notifies attention to the effect that the correction amount is large.

When the analysis apparatus is a fluorescent X-ray analysis apparatus, and the error is not notified or the quantitative analysis value is corrected without stopping of the quantitative analysis, the drying portion 114 dries the liquid droplet 202 so that the object to be measured is held on the surface of the substrate 104. Next, the conveyance device conveys the substrate 104 having been subjected to treatment in the pretreatment portion to the analysis portion. Finally, the analysis portion irradiates the object to be measured with an X-ray and performs the quantitative analysis of an element contained in the object to be measured based on a fluorescent X-ray output from the object to be measured.

Further, when the analysis apparatus is an inductively coupled plasma-mass spectrometer (ICP-MS) for analyzing a liquid sample, an atomic absorption spectrometer (AAS), or the like, the liquid droplet 202 is directly loaded on the analysis apparatus, and the element contained in the object to be measured is subjected to the quantitative analysis. The quantitative analysis value is corrected through use of the correction coefficient calculated in the first calculating portion.

The present invention can be variously modified without being limited to the above-mentioned examples. The configurations of the fluorescent X-ray analysis apparatus and the like are each described as one example, and the present invention is not limited thereto. The configurations described in the above-mentioned examples may be replaced by configurations that are substantially the same as the configurations described in the above-mentioned examples, configurations that exhibit the same action and effect as those of the configurations described in the above-mentioned examples, or configurations that achieve the same object as that of the configurations described in the above-mentioned examples.

For example, the collecting portion 106 of the present invention may be separated from the analysis portion and the conveyance portion included in the analysis apparatus. For example, the collecting portion 106 may be constructed as an independent sample collecting device configured to collect the impurity adhering to the substrate 104.

Specifically, the collecting portion 106 may be constructed as a sample collecting device including the beam sensor configured to emit the laser 204 having a band shape to the liquid droplet 202, after the liquid droplet 202 is dropped onto the substrate 104 having the object to be measured on the surface thereof and the dropped liquid droplet 202 is moved on the surface of the substrate 104 to collect the object to be measured into the liquid droplet 202, and the calculating portion configured to calculate the correction coefficient for correcting the amount of the liquid droplet 202 or the quantitative analysis value of the object to be measured based on the detection result of the beam sensor.

Modification Example

Figure 10:
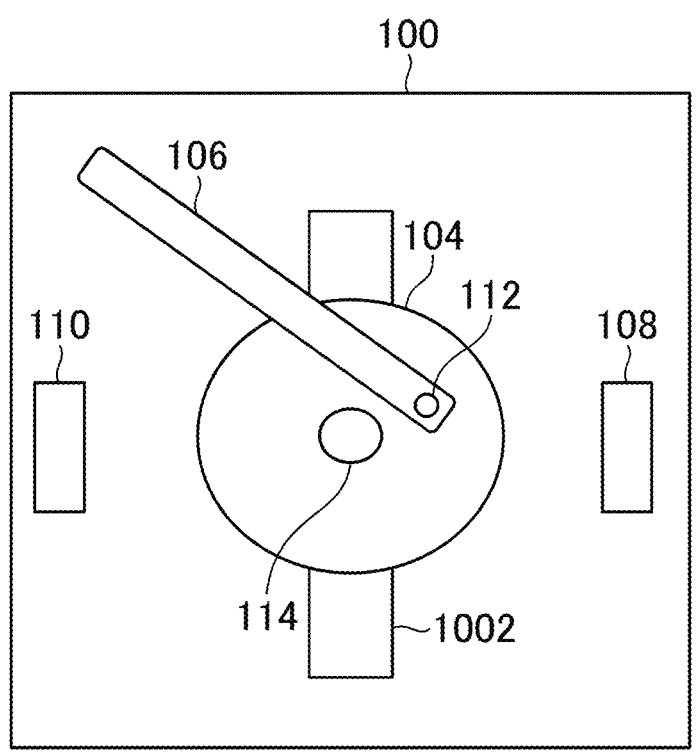
FIG. 10 are each a view for schematically illustrating a pretreatment portion according to a modified example.
Figure 10:
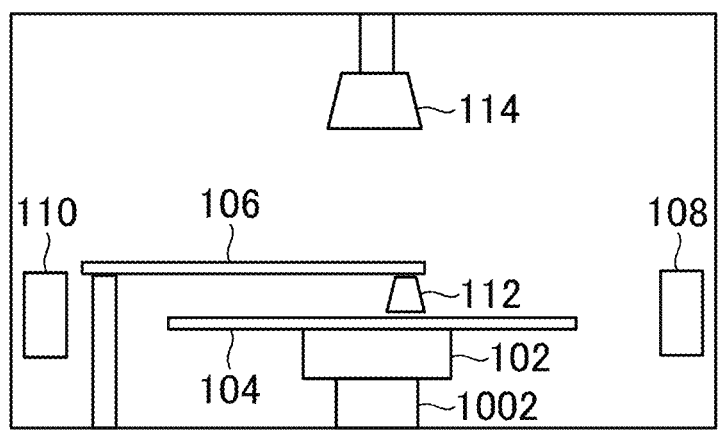

Subsequently, a modified example of the present invention is described. FIG. 10 are each a view for illustrating a pretreatment portion according to this modified example. FIG. 10(a) is a view of the pretreatment portion when viewed from above, and FIG. 10(b) is a view of the pretreatment portion when viewed from a side surface. As illustrated in FIG. 10, a pretreatment chamber 100 according to this modified example is different from that of the above-mentioned examples in that the pretreatment chamber 100 includes a moving mechanism 1002. The configurations other than the moving mechanism 1002 are the same as those of the above-mentioned examples.

Also in this modified example, the beam sensor may be a regression reflection type beam sensor or a transmission type beam sensor.

Figure 11:
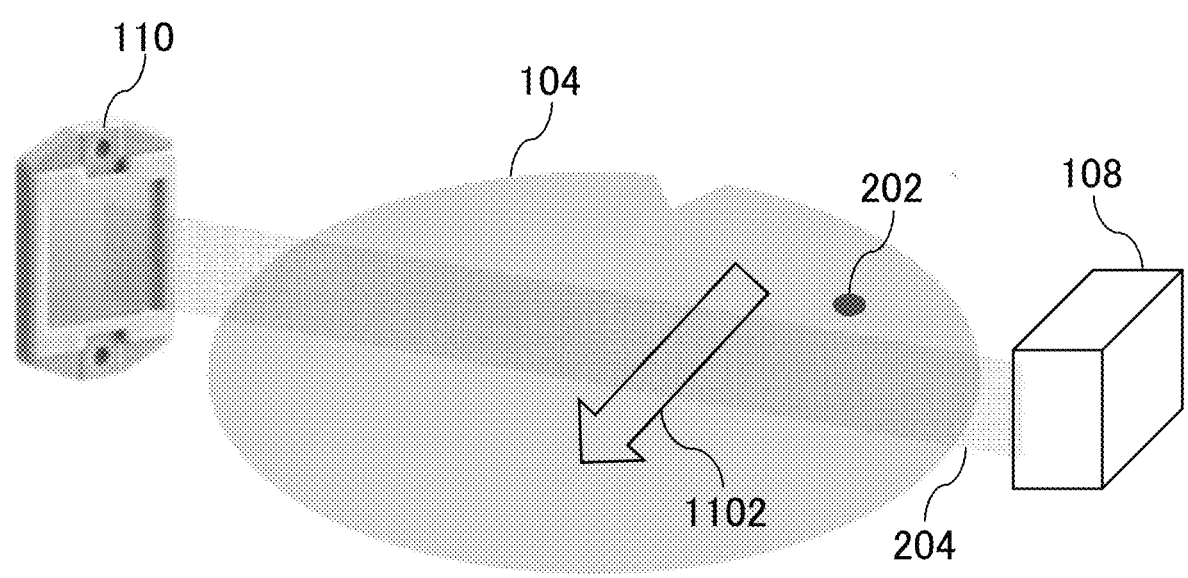
FIG. 11 is a schematic view of a liquid droplet irradiated with a laser according to the modified example when viewed from a side surface of a substrate.

The moving mechanism 1002 is configured to move the substrate 104 so that the liquid droplet 202 crosses the laser 204 having a band shape. Specifically, for example, the moving mechanism 1002 includes a rail and a motor arranged on a lower side of the rotating table 102. The moving mechanism 1002 is configured to move the rotating table 102 having the substrate 104 arranged thereon in a direction of an arrow 1102 along the rail (see FIG. 11) by driving the motor. Through this operation, the liquid droplet 202 crosses the laser 204 having a band shape. When the liquid droplet 202 crosses the laser 204 having a band shape, the light reception amount received by the light receiver changes. As a result, in the same manner as in the above-mentioned embodiment, the amount of the liquid droplet 202 can be accurately detected.

According to this modified example, the distance between the beam sensor and the liquid droplet 202 is constant. Therefore, an output of the beam sensor, which does not depend on the position of the liquid droplet 202, can be obtained. Thus, an accurate detection result can be obtained without correction based on the distance of the liquid droplet 202 from the center of the substrate as described with reference to FIG. 8 and FIG. 9.

It is desired that, before the moving mechanism 1002 moves the substrate, the rotating table 102 rotate the substrate 104 so that the liquid droplet 202 is formed in the vicinity of the laser 204 having a band shape. As result, the moving range of the substrate 104 can be shortened, and hence the moving mechanism 1002 can be reduced in size.

Further, it is desired that the direction in which the substrate 104 is moved be parallel to the surface of the substrate 104 and be orthogonal to the laser 204 having a band shape. In this way, the moving distance of the substrate 104 can be shortened.

Further, in this modified example, the pretreatment portion may not include the rotating table 102. Through the configuration of the pretreatment portion without the rotating table 102, each configuration included in the pretreatment portion can be controlled with a control program simpler than that in the above-mentioned examples.

REFERENCE SINGS LIST 100 pretreatment chamber, 102 rotating table, 104 substrate, 106 collecting portion, 108 beam sensor main body, 110 reflective plate, 112 nozzle, 114 drying portion, 202 liquid droplet, 204 laser, 1002 moving mechanism, 1102 direction for moving substrate

The invention claimed is:

1. A fluorescent X-ray analysis apparatus or system, comprising:
a sample collecting device including a collecting portion, and
a beam sensor and a calculating portion, the calculating portion implemented by an arithmetic logic unit,
the collecting portion configured to drop a liquid droplet onto a substrate having an object to be measured on a surface thereof and move the dropped liquid droplet on the surface of the substrate to collect the object to be measured into the liquid droplet;
the beam sensor configured to emit a laser having a beam shape to the liquid droplet, and obtain a height profile representing distribution of a height of the liquid droplet from the surface of the substrate;
the calculating portion is programmed to obtain the height profile and to calculate a correction coefficient for correcting a quantitative analysis value of the object to be measured based on the height profile,
a drying portion configured to dry the liquid droplet so that the object to be measured is held onto the surface of the substrate; and
an analysis portion configured to irradiate the object to be measured with an X-ray and perform quantitative analysis of an element contained in the object to be measured based on a fluorescent X-ray output from the object to be measured.

2. The fluorescent X-ray analysis apparatus or system according to claim 1, wherein the beam sensor is arranged so that the laser is emitted with a traveling direction being parallel to the surface of the substrate, and the beam sensor is configured to emit a laser having a band shape and the band of the laser is perpendicular to the surface of the substrate.

3. The fluorescent X-ray analysis apparatus or system according to claim 2, wherein the beam sensor comprises a regression reflection type beam sensor including a beam sensor main body that includes an oscillator configured to emit the laser and a light receiver configured to receive the laser and a reflective plate opposed to the beam sensor main body.

4. The fluorescent X-ray analysis apparatus or system according to claim 2, wherein the beam sensor comprises a transmission type beam sensor including an oscillator configured to emit the laser and a light receiver arranged so as to be opposed to the oscillator and configured to receive the laser.

5. The fluorescent X-ray analysis apparatus or system according to claim 1, further comprising a moving mechanism configured to move the substrate so that the liquid droplet crosses the laser having a beam shape.

6. The fluorescent X-ray analysis apparatus or system according to claim 1, further comprising a rotating table configured to rotate the substrate within a horizontal plane when the laser is emitted to the liquid droplet.

7. The fluorescent X-ray analysis apparatus or system according to claim 6, wherein the calculating portion is configured to calculate the correction coefficient based on the height profile and a correlation in accordance with a distance from a center at which the substrate is rotated by the rotating table to the dropped liquid droplet.

8. The fluorescent X-ray analysis apparatus or system according to claim 1, further comprising a warning notifying portion configured to notify a warning when a difference between an amount of the liquid droplet calculated based on the height profile and a value set in accordance with the amount of the dropped liquid droplet is larger than a value set in advance.

9. The fluorescent X-ray analysis apparatus or system according to claim 1, wherein the calculating portion calculates the amount of the liquid droplet on the substrate based on the height profile, and calculates the correction coefficient based on a ratio between the amount of the dropped liquid droplet and the calculated amount of the liquid droplet.

10. The fluorescent X-ray analysis apparatus or system according to claim 1, wherein the object to be measured is an impurity.

\* \* \* \* \*